United States Patent [19]

Zumbrunnen

[11] 4,133,969

[45] Jan. 9, 1979

[54] HIGH FREQUENCY RESISTANCE MELTING FURNACE

[76] Inventor: Allen D. Zumbrunnen, 419 Sherman Ave., Salt Lake City, Utah 84115

[21] Appl. No.: 866,355

[22] Filed: Jan. 3, 1978

[51] Int. Cl.² ............................................. H05B 3/60
[52] U.S. Cl. .......................................... 13/23; 13/26; 156/617 M
[58] Field of Search ...................... 13/20, 23, 26, 27, 5; 156/617 SP, 617 M, 617 V, 600, 602, 621, 622, 624

[56] References Cited

U.S. PATENT DOCUMENTS

| | | | |
|---|---|---|---|
| 2,852,420 | 9/1958 | Pohl | 156/617 SP |
| 3,296,036 | 1/1967 | Keller | 156/617 M |
| 3,360,405 | 12/1967 | Keller | 156/617 M |

*Primary Examiner*—R. N. Envall, Jr.
*Attorney, Agent, or Firm*—M. Reid Russell

[57] ABSTRACT

The present invention relates to a new type of electric furnace and process for its use for highest purity melting of certain metals and semiconductor materials, particularly it is well suited for melting materials that would react chemically with standard refractory crucible materials thus potentially resulting in a contamination of such melt. The present invention utilizes a skull, formed to fit within a heat absorbing container, the skull formed from the metal or semi-conductor material to be melted, heating of such material being accomplished by a direct resistance coupling through electric contacts of a high frequency alternating current source to the material that utilizes the proximity effect involved with a high frequency current passed through a conductor with the forward current conductor of the present invention being arranged across and proximate to the melt surface thereby causing a return current to reproduce, in the melt, the shape of the forward conductor thereabove providing direct resistance heating of the melt.

26 Claims, 8 Drawing Figures

HIGH FREQUENCY RESISTANCE MELTING FURNACE

BRIEF DESCRIPTION OF THE INVENTION

The Field of the Invention

This invention relates to electric furnaces and procedures for their use for providing a highest purity melting of certain metals and semiconductor materials.

BACKGROUND OF THE INVENTION

Where extreme purity melting of certain metals and semiconductor materials is required, the difficulties with contaminants entering the melt from the material of the crucible have occasioned a number of different furnace arrangements and refining techniques. Considerable technology has been expended to construct crucibles for minimizing contamination of the materials from which they are constructed passing into a melt therein. Thus, for example, crucibles for melting highest purity silicon have been made from or lined with fused silica, silicon carbide, graphite, or similar high melting material that is essentially indifferent to silicon, to minimize melt contamination. However, less than satisfactory results have been achieved as these crucibles, when exposed to the heat required to melt their contents will transfer, even in small quantities, the crucible material to the melt thereby causing contamination thereto.

PRIOR ART

The need for providing contamination free melting for certain materials has prompted development of different crucible arrangements. One approach for so providing is shown in U.S. Pat. No. 3,051,555, which patent involves a skull formed for installation within a crucible of the same material intended to be melted therein, and provides for cooling of the crucible to prohibit melting of the skull and destruction of the crucible during heating therein. Like the present invention this furnace utilizes a skull arrangement, and, while it provides for crucible cooling, it does not provide, as does the present invention, for a closely controllable skull cooling suitable for exactly maintaining a specific temperature drop through the skull. Nor does this furnace, as does the present invention, provide for a direct resistance coupling of a current source to the melt, utilizing a proximity effect phenomenon involved with back and forward current flow through conductors arranged proximate to one another.

The above cited U.S. Pat. No. 3,051,555 and certain other U.S. Pat. Nos. 1,939,623; 3,549,353, and 3,867,563, have all involved different arrangements for inductively coupling a melt contained in a crucible to a high frequency alternating current source, which arrangement can obviously vary in coupling efficiency whereas, the furnace of the present invention is 100% effective since all of the current that flows through the crucible circuit also flows through the melt.

The proximity effect of a high frequency current that is relied upon by the present invention is dependent upon the geometry of the electric circuit formed by the conductors. Specifically, by making available a return current path proximate or close to a forward current path, the return current will try to stay as close to that forward current path as possible. This current flow will occur even though its path through the melt is of greater resistance than another current path, as say, for example, a path around the liner or skull. The present invention, utilizing this current trait, positions a forward conductor carrying a forward current over and proximate to the top of the material to be melted, the return current path thereby tracing through the melt the shape of that forward conductor, which melt current path is of lesser inductance.

The proximity effect phenomenon has heretofore been used for purposes such as butt welding. Within the knowledge of the inventor, however, furnace apparatus, or the like, prior to the present invention, have not adapted this phenomenon to a direct resistance coupling of a melt to a current source. An example of a utilization of the proximity effect adapted for welding is shown in an article entitled, "Bar Butt Current Penetration Welding — A New High Frequency Process," by Wallace C. Rudd. This paper was presented at the AWS National Fall Meeting held in Baltimore, Maryland, during October 5 through 8, 1970. Another paper dealing with skin effect and proximity effect entitled, "Skin Effect and Proximity Effect" by C. A. Tudbury was presented at the 6th Biennial I.E.E.E. Conference on Electrical Heating in New York, I.E.E.E. 1963, pages 78 through 88 of a report on the conference.

The furnace of the present invention provides for a direct coupling of a high frequency electric current source to a melt producing thereby an efficient means for generating heating energy in such melt and balancing it against the heat losses from the molten charge and surrounding skull in such a way as to maintain the skull in a solid state. The present invention thereby provides for a very simple and yet reliable furnace apparatus for producing a highest purity melting of silicon and titanium, or the like.

Within the knowledge of the inventor there has not heretofore existed a high frequency resistance melting furnace like that of the present invention nor has there, within the knowledge of the inventor, been an application of the current proximity effect phenomenon to an electric furnace. The present invention is therefore believed to be both novel and unique to the electric furnace art and a significant improvement over prior highest purity melting and reactive metal melting apparatus and methods.

SUMMARY OF THE INVENTION

It is the principle object of the present invention to provide an electric furnace for melting reactive metals and semiconductor materials such that the melt will be of highest purity with respect to any transfer of materials from a container wherein that melt is maintained.

Another object of the present invention is to provide an electric furnace for melting reactive metals and semiconductor materials to avoid contamination of that melt that utilizes a skull of the melt material fitted as a liner within a heat absorbing container of special design, that skull being replaceable such that the container and associated apparatus can be used to melt different materials.

Another object of the present invention is to provide an electric furnace that utilizes direct resistance coupling of a high frequency current to a melt, the term "high frequency current" being interpreted to mean any cyclic or oscillating electric current in the same frequency range as commonly adapted to induction heating practice.

Still another object of the present invention is to provide an electric furnace that utilizes electrical phenomena known as "skin effect" and "proximity effect", which skin effect involves the tendency of a high frequency alternating current to flow on the surface of a conductor, with the proximity effect involving the tendency of forward and return currents to flow as close to one another as possible, this proximity effect to be used to induce a current to flow in a narrow path through a melt material providing thereby for a direct resistance coupling of that melt to a current source.

Still another object of the present invention is to provide an electric furnace that involves a direct resistance coupling of a melt therein to a high frequency current source for providing a closely controlled current flow through that melt producing thereby just that heat necessary to melt the material but not so high as to cause a melting of a liner or skull fitted into a heat absorbing container of the furnace wherein the materials are melted.

Still another object of the present invention is to provide an electric furnace capable of measuring and controlling the surface temperature of a liner or skull arranged in a heat absorbing container thereof in order to maintain a substantially constant temperature drop therethrough.

Still another object of the present invention is to provide an electric furnace capable of controlling heat loss from a liner or skull arranged in a heat absorbing container thereof to maintain the skull wall thickness at a relatively constant and pre-selected value.

Principal features of the present invention in a high frequency resistance melting furnace include a heat absorbing container of special design that is adapted to receive a liner or skull to contain a melt that is formed from the material to be melted. By changing, appropriately, liners or skulls, different metals and semiconductor materials can be melted in the single container, the liner or skull preventing contamination of the melt by transfer of material from a refractory crucible that might otherwise be used, providing thereby for a high purity of melt. The liner or skull, during the melting process, is kept below its melting temperature by a heat transfer between it and a cooled shell that is cooled by passage of fluid or gas through cooling coils wrapped therearound. The cooled shell, additional to the cooling coils, has thermally insulative supports extending inwardly therefrom for supporting a refractory supporting shell whereon the liner or skull is arranged to rest. Spaces are arranged between the insulative supports that should be understood to be capable of having a vacuum affected therein. Within the spaces between the refractory supporting shell and cooled shell can be arranged radiation shields. Heat transfer between the cooled shell and liner or skull can thereby be closely controlled by placement of appropriate numbers of radiation shields in said spaces, which shields can even have holes formed therethrough for more closely controlling their individual insulation properties. As an alternative to, or in conjunction with, the radiation shields, a refractory insulation could be placed in said spaces between the refractory supporting shell and the cooled shell for controlling the rate of heat loss from the skull. Also, adjustments to the heat loss can be effected by varying the degree of vacuum in that space, the rate of heat transfer increasing as the pressure in the space is increased.

The ability to closely control the heat transfer between the liner or skull and the cooled shell provides for a matching of the melt heat input, controlled at the power supply, with the heat loss from the skull, thereby establishing an equilibrium condition that is characterized by a constant temperature drop through the skull for maintaining a constant skull wall thickness. It should be further understood that such a heat balance can be varied within wide limits to either increase or decrease the thickness of the skull as might be desired and to otherwise optimize the functioning of the device.

The present invention as mentioned hereinabove, utilizes a direct coupling of the high frequency current source to the melt, that coupling relying on the proximity effect, with passage of a current through a forward conductor providing an attraction to a return current, that return current, attracted to the forward current flow tending to flow as close to the forward conductor as possible. The electric furnace of the present invention utilizes this phenomena by placing a forward conductor across and appropriately close to a melt surface, the return current thereby being induced to flow through that melt tracing therethrough the shape of the forward conductor. The current path through the melt, while it may not be of least resistance, provides a path of lesser inductance. So arranged that the return current flow path will be through the melt rather than around the liner or skull, heating the melt by the relationship, the current squared times the resistance, $I^2R$.

Optionally, the present invention also involves the utilization of a magnetic "core" of high permeability material such as laminated iron, partially fitted around the forward conductor such that an open portion of the forward conductor will be positioned directly above the melt. The effect of said magnetic core being to intensify the proximity effect and to further localize a return current through the melt, altering as needed, the resistance of that passage for further closely controlling the temperature of that melt and providing for an efficient power utilization.

It is well known that any passage of current through a conductor creates, therearound, a magnetic field. The present invention utilizes the squeeze effect and other "motor" effects of that magnetic field, such effects providing a churning of the materials of the melt, causing a circular flow of the melt materials around the current path through the melt, stirring the melt to provide a substantially uniform temperature therethrough.

With the capabilities of the electric furnace of the present invention to control the temperature of the melt balanced against its heat losses, it insures that the liner or skull will be maintained in a solid state. With the skull maintained in a solid state, it is therefore possible to continuously remove an ingot while adding materials to the melt to maintain the level thereof within required limits to maintain the proximity effect such that the return current will trace the path of the forward conductor therethrough.

The present invention to provide for a maximum efficiency of current flow can involve many electric contacts spaced around and into the liner or skull, which contacts are preferrably widely spaced to minimize proximity and constriction heating effects on the outside surface of the skull in the contact area. Furthermore, the cylindrical portion of the contact which forms the bridge between the bus bars and the contact point on the skull preferrably has its cross-sectional area and length so proportioned that the joule heat developed along its length is equal to twice the conductive heat loss that would occur through it if no current were flowing. Under such conditions the heat loss to the relatively cold bus bars is at a minimum.

DETAILED DESCRIPTION

Referring now to the drawings:

The present invention relates to a high frequency resistance melting furnace for the melting of conductive metals and semiconductor materials, the electric furnace of the present invention being particularly well suited to the melting of materials that would react chemically with common refractory crucible materials, such reaction contaminating the melt. The present invention to avoid such crucible contamination provides for forming of a liner or skull 11, shown best in FIG. 3, hereinafter referred to as skull 11, of the metal or semiconductor material to be melted. Skull 11 is arranged within the heat absorbing container to serve as the melt crucible thereby practically eliminating melt contamination problems.

Figure 1:
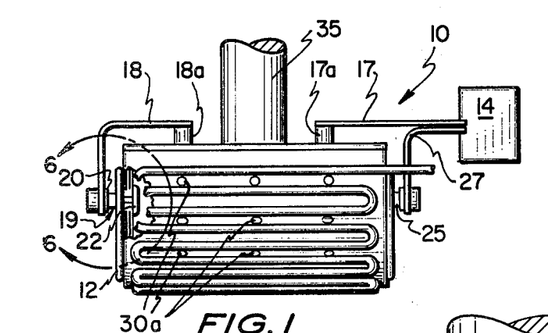
FIG. 1, is a front elevation view of an electric furnace of the present invention showing a block schematic of a high frequency power supply with a section shown broken away to expose a forward contact that connects that power supply to a skull of the electric furnace and showing an ingot being pulled therefrom, the furnace to be housed in a containment vessel, not shown, in accordance with widely known art.
Figure 2:
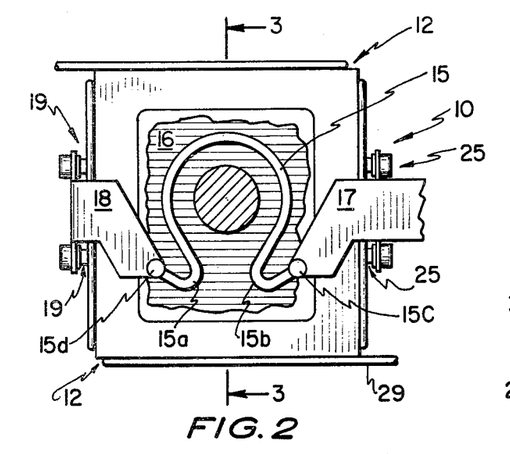
FIG. 2, a top plan view of the electric furnace of FIG. 1.

In FIG. 1 is shown a front elevation view of the preferred arrangement of the electric furnace 10. In FIG. 2 the electric furnace is shown in a top plan view, and in FIG. 3 the electric furnace being shown as a profile sectional view. Shown best in FIG. 3, the electric furnace 10 involves a heat absorbing container 12, hereinafter referred to as container 12, that has the skull 11 fitted therein, which skull 11, as stated hereinabove, is formed from the metal or semiconductor material to be melted. Skull 11 is formed by casting methods or by sectioning a right cylinder of the appropriate material lengthwise to produce a half section of appropriate dimensions. Such skull 11 can be easily removed and replaced with another skull, as needed, for melting a different metal or semiconductor material. Skull 11, formed by sectioning, it should be noted, is in essence formed during the melting process by the special heat flow balance to be described in detail later herein. The skull 11, and its contents will normally be a monolithic body before heating to the melt temperature.

Figure 3:
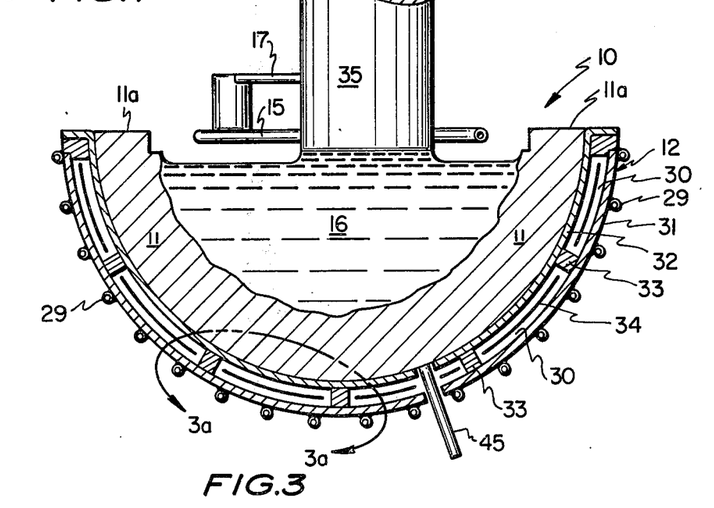
FIG. 3, a sectional view taken along the line 3—3 of FIG. 2 exposing the interior of the heat absorbing container of the electric furnace showing a liner or skull arranged therein that maintains a melt of metal or semiconductor material.

It is, of course, well known that electrically conductive metals and semiconductor materials, when subjected to an electric current, will be melted by that exposure, the electric current producing heat by the electron flow therethrough. Such melt can then be poured into molds for the production of castings (it is not necessary to disconnect the power), or an ingot can be pulled vertically from the melt, as shown in FIGS. 1 through 3, requiring that the melt connected to the current source have replacement materials added thereto as the ingot is pulled. The present invention, by providing a direct coupling of the melt to a high frequency current source, avoids the problems inherent with electric-arc or electron-beam furnaces concerned with the fabrication of consumable electrodes, for use with those furnaces. Also, the inherent explosion hazard in an arc-furnace due to the possible puncture of its water cooled crucible by the arc is avoided in the present invention.

Obviously, as with other electric furnaces, the material to be melted in such furnace must be capable of conducting electricity therethrough sufficiently to obtain a desired heating effect. The present invention, to provide direct coupling of a high frequency current source 14, shown in FIG. 1, involves a utilization of certain electronic phenomena known as "skin effect" and "proximity effect". Skin effect involves the tendency of an alternating current to flow on the surface of a conductor, which surface flow is dependent upon the frequency of that current. The higher the frequency, the more the tendency for that current to flow on the conductor surface.

Figures 4, 5, 6:
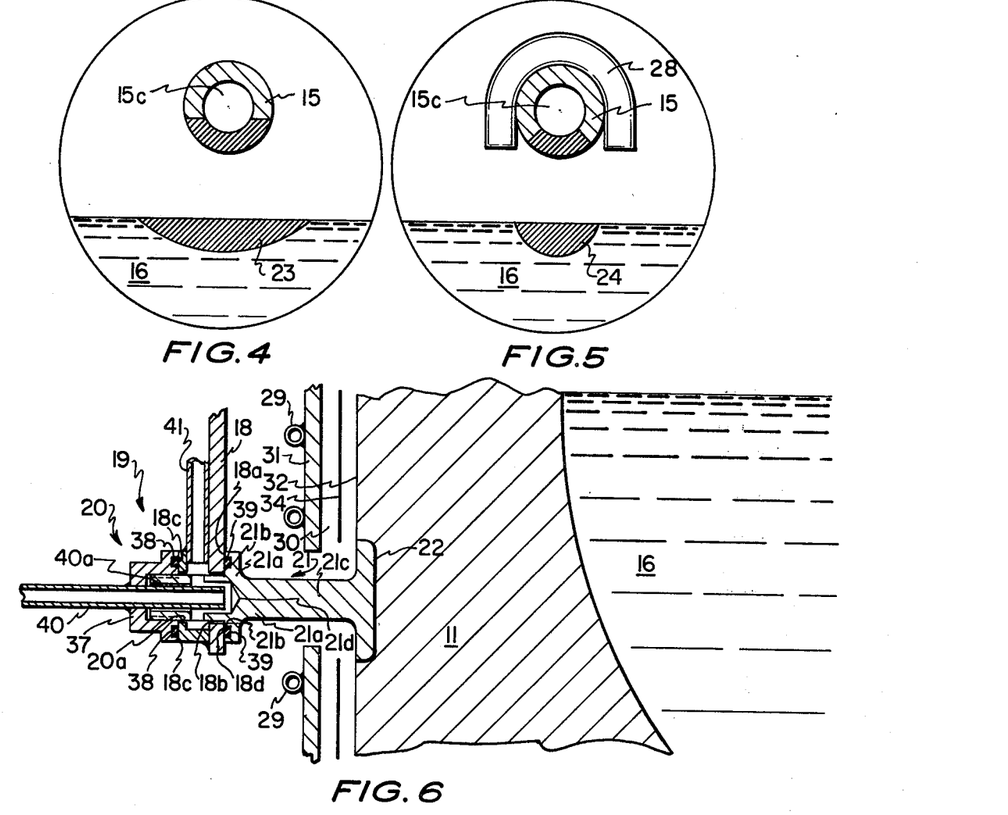
FIG. 4, a sectional view of the forward conductor shown in FIGS. 1 through 3 and a portion of the melt showing the flow of forward and return currents.
FIG. 5, a view like that of FIG. 4, but showing a magnetic core of high permeability material arranged around a portion of the forward conductor, showing the shape of the return current path through the melt shown as having been altered by the effect of that magnetic core.
FIG. 6, a sectional view taken within the line 6—6 of FIG. 1 showing an expanded preferred contact arrangement for passing a return current flow therethrough into the melt.

The electrical phenomena identified hereinabove as proximity effect describes the tendency of forward and return currents, in closely spaced conductors, to flow as close to one another as possible. The proximity effect, similar to the skin effect, also increases with increased frequency, a high frequency alternating current tending to follow a path of lowest inductance. Minimum inductance, it should be understood, is achieved in a circuit when the path of opposite flowing currents encloses the smallest area, thus inhibiting expansion of the magnetic fields which surround the respective conductors. The current flowing in the circuit of the electric furnace 10, shown in FIG. 4, is along opposite faces of the parallel conductors.

The electric furnace 10 utilizes a high frequency current, that current thereby flowing on the outer lower surface of a forward conductor 15, shown in FIGS. 1 through 5, so as to have the greatest influence on a return current path, in accordance with the proximity effect, which return current path is through the material in the furnace. Shown in FIG. 5, the proximity effect, or localization of the current can be further intensified in the melt by the arrangement of a high permeability core 28 formed or fitted around the forward conductor 15. Core 28 causes an increase in the flux density of the magnetic field which surrounds the forward conductor and occupies the space immediately above the melt surface, which intensified field increases the proximity effect of the forward conductor and shrinks the area of the return current flow to that shown at 24 in FIG. 5, thereby increasing the electrical resistance therethrough.

The present invention utilizes the proximity effect to facilitate electrical matching of the melt to the current source. A current path is established through the melt by placing the forward conductor, appropriately bent, immediately above the melt, the return current flow through the melt approximately tracing the shape of that forward conductor thereabove. So arranged, the melt is heated by direct current passage through the relationship the current squared times the electrical resistance of the area of the melt through which the current passes, or $I^2R$.

As shown best in FIGS. 1 and 2, the furnace 10 preferrably involves the forward conductor 15 having a horseshoe shape such that an ingot 35 can be pulled from the open center thereof. The forward conductor 15 passes over a large area of a melt 16, and is preferrably shaped so as to avoid sharp angles therein, it being curved gradually at bends 15a and 15b to prevent short circuiting of a corresponding melt current at these locations. The forward conductor 15 also preferably contains a channel 15c for passing liquid or gas coolant to maintain it at a cool temperature for good electrical conduction. The current entering the forward conductor 15, shown in FIG. 1, comes from the high frequency current source 14 through a bus bar 17, which forward conductor 15 as shown best in FIG. 3, is spaced slightly above and extends parallel to melt 16. Current passes through forward conductor 15 passing across melt 16 and through a bus bar 18 that couples to the forward contact 19, that is shown best in FIG. 6. The forward contact 19 consists of a body 20 having a contact end 21, which contact end is shown in FIG. 6 to have a large head 22 with rounded corners that is bonded within skull 11, preferrably by brazing, or the like, to form a joint having good properties of electrical conductivity. Shown in FIGS. 1 and 6, the current entering contact 19 from bus bar 18 passes through the contact head 22 into skull 11, traveling therethrough and is condensed, as shown in FIGS. 4 and 5, to flow through melt 16 below the forward conductor 15, tracing the path of that forward conductor 15, that passage heating the material of the melt. Current passes from melt 16 through the skull 11 and into a return contact head 26, shown in broken lines in FIG. 1, of return contact 25, that current flowing through a return bus bar 27 back into the high frequency supply 14. Both forward and return contacts 19 and 25, it should be understood, are preferably alike, the heads 22 and 26 thereof, as will be explained in detail later herein, to effect a desirable heat dissipation, each have diameters that are larger than the diameters of the narrowed center portions of the individual contact. Also, to prohibit unwanted heat buildup around the contact heads, more than one each forward and return contacts 19 and 25 can be installed in skull 11 connected electrically to the current source. Shown in FIG. 2, two each forward and return contacts 19 and 25 are arranged through container 12 and into skull 11.

The above described arrangement, where the placement of the forward conductor 15 across melt 16 controls the return current path through that melt, provides a direct coupling of melt 16 to the current source 14. The melt is thereby heated by the relationship current squared times the electrical resistance, or $I^2R$. The direct coupling of the melt to the current source allows for a modification of the melt temperature in localized areas by altering the resistance of the current passage through the melt, where the change is to be effected. One approach already touched upon herein for altering the resistance of the melt 16 current path 23, shown in FIG. 4, to current path 24, shown in FIG. 5, is by a partial covering of the forward conductor 15 with a magnetic core 28, the effect of which core is to intensify the proximity effect exerted by the forward conductor and to thereby alter the electrical resistance of the melt to current flow by altering the cross section of that return current flow path through the melt 16. As provided or outlined in the above discussion, the addition of the magnetic core 28 to the proximity conductor 15 tends to concentrate and increase the magnetic flux density immediately opposite to the melt 16 causing an improvement in the proximity effect exerted by the forward conductor that in turn changes the resistance to current flow of the return current through the melt.

Figure 3A:
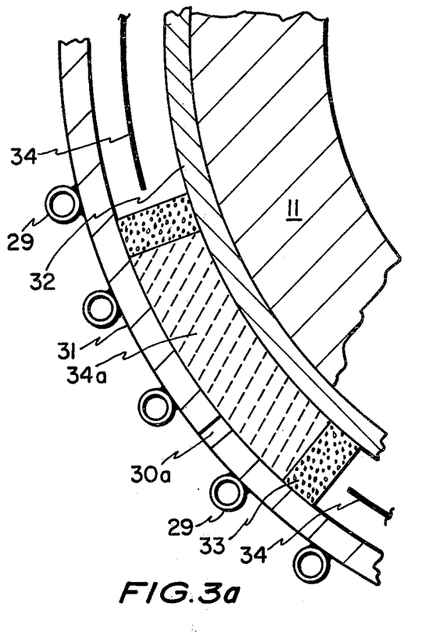
FIG. 3a, a sectional taken within the line 3a—3a of FIG. 3 showing another embodiment of an insulative arrangement.
Figure 7:
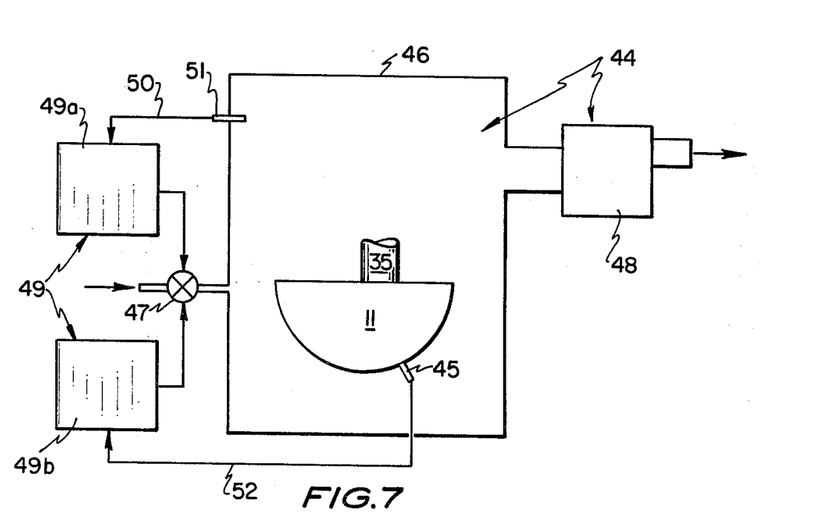
FIG. 7, a block schematic representation of an arrangement for automatically controlling heat flow from the liner or skull of FIG. 3.

The electric furnace 10 of the present invention, in addition to providing an operator with the ability to control heat input to the melt by adjustments to the power supply, provides also for a close control of the outer skin temperature of skull 11, within reasonable operating limits, by control of its heat loss to container 12 while at the same time monitoring its surface temperature by means of a temperature sensor 45, such as a thermocouple, or the like, that is shown in the schematic of FIG. 7, attached to, or in contact with the skull 11 outer surface. Shown in FIG. 7, the temperature sensor 45 is part of a heat flow control arrangement 44, which arrangement includes, in addition to the components shown in FIG. 7 that will be described in detail later herein, portions of container 12 including radiation shields 34 that are arranged in chambers 30, shown best in FIG. 3, formed between a cooled shell 31 and a refractory supporting shell 32 that serve as the primary heat sink for the heat that is lost from the skull 11. Cooled shell 31 is further cooled by the passage of a coolant, either liquid or gas through cooling coils 29, that, as shown best in FIGS. 1 and 3, are arranged to encircle and make good thermal contact with cooled shell 31. The temperature of cooled shell 31 may be closely controlled by adjustments to the coolant flow rate through coils 29, for the purpose of finely controlling its heat absorbing characteristics. Alternatively to radiation shields 34, as shown best in FIG. 3a, a refractory insulation material 34a, shown in FIG. 3a, or the like, could be installed in chambers 30 in addition to or as a replacement for radiation shields 34. Such refractory insulation material could be solid, as shown in FIG. 3a, or could be porous, the pores being open to the ambient furnace atmosphere, as are all chambers 30, through vent holes 30a, shown in FIGS. 1 and 3a. Supporting shell 32 is preferably fabricated from either a high melting point metal such as molybdenum or a suitable ceramic material and is intended to maintain dimensional stability of skull 11.

For spacing apart the refractory supporting shell 32 and cooled shell 31 into individual chambers 30 insulation supports 33 are arranged therebetween. The individual chambers 30 are preferably open as shown by a vent hole 30a in FIG. 3a, to the furnace ambient atmosphere; which atmosphere, it should be understood, is a vacuum. The radiation shields may include the presence or absence of holes formed therethrough to provide for a control of heat exchanges therethrough. The present invention, by selective addition or deletion of such shields being thereby capable of closely controlling the heat transfer therethrough to insure that skull 11 will remain below its melting temperature during a melting of materials therein.

The present invention, by providing for a sensing of the skull 11 surface temperature and with knowledge of certain constants concerned with the material from which the skull 11 is formed, enables a controlling of the skull thickness. With skull 11 thickness labeled t, then that thickness, t, is equal to the thermal conductivity coefficient of the skull material, k, times the melting point of the material, $T_m$, less the surface temperature of the skull, $T_s$, divided by the heat flow rate, q, through the skull, or:

$$t = \frac{k(T_m - T_s)}{q}$$

Heat transfer from skull 11 to the container 12 can also be controlled by adjustments to the vacuum contained in chambers 30. Such control is possible because of the dependency of the heat transfer properties of a gas on its pressure when the pressures involved are in the vacuum range, such range being understood to include any pressure below atmospheric pressure. Thereby, increasing the pressure will cause an increased heat transfer rate and vice-versa. Referring to FIG. 3 and the schematic representation in FIG. 7, the vacuum in chambers 30 is essentially the same as the ambient vacuum existing in a furnace containment vessel 46 shown as a box in the schematic of FIG. 7 as surrounding furnace 10. Since chambers 30, as shown by vent hole 30a in FIG. 3a, and holes 30a in FIG. 1 are preferably open to the furnace atmosphere, the ambient vacuum and hence the vacuum in chambers 30, is best controlled by introducing an inert gas, such as helium or argon into the containment vessel 46. A bleed valve 47 is provided entering containment vessel 46 to enable a balancing between the rate of gas bleed and the evacuation rate of the containment vessel by the vacuum pump 48, to achieve a specific equilibrium pressure. Such pressure will normally be selected by experiment to yield the desired results. Bleed valve 47 may be manually operated but is preferably controlled by a servo-mechanism 49 that is arranged as two servo units 49a and 49b, servo 49a being connected by wire 50 to receive an input signal from a pressure sensor 51 that is located in the containment vessel 46 and servo 49b being connected by wire 52 to the temperature sensor 45, servo mechanism 49 thereby providing the capability to maintain either a constant pressure or constant temperature automatically in accordance with the information obtained from the respective sensors. With bleed valve 47 connected to receive signals from the temperature sensor 45, the bleed gas therethrough would be introduced into the containment vessel in a fluctuating but controlled way to maintain a constant skull surface temperature, or, of course, the bleed valve 47 could be connected to the pressure sensor 50 only feeding gas into containment vessel 46 to maintain a constant pressure therein without regard to the temperature of skull 11, with both techniques achieving the primary purpose of controlling the rate of heat loss from the skull 11. The foregoing adaptations of a servo-mechanism to control a valve are, of course, carried out according to widely accepted practice.

The present invention, as described hereinabove, involves an arrangement for closely controlling the outer temperature of the skull 11 and heat transfer therethrough, along with the ability to closely control the melt current thereby controlling the melt temperature. Depending upon skull thickness, and the thermal conductance thereof, which conductance, of course, varies with differences in the materials from which the skull is constructed, the temperature drop thereacross can be controlled by the addition or deletion of radiation shields 34 from chambers 30 or by other techniques described hereinabove, maintaining the high purity of a melt by operating the skull 11 surface temperature at a sufficiently low value to prevent the materials from the refractory supporting shell from being absorbed by diffusion into that melt. Also, the ability of the electric furnace 10 of the present invention to provide a close balancing between melt heat input and skull temperature minimizes the energy required to operate the device providing, thereby, a most efficient energy utilization.

In practice, after calculating the number of radiation shields 34 needed to achieve a balancing of container cooling effect with the melt heat input to maintain the skull 11 in a solid state, with a desired temperature drop therethrough, by experimentation or in actual practice, radiation shields 34 can be added to or removed from chambers 30 to optimize the operating conditions that have been selected or the furnace melt chamber pressure can be adjusted to achieve the same result.

As shown best in FIG. 1, preferred arrangement of the forward conductor 15 involves placing that conductor close to the melt 16 with the ends 15c and 15d thereof each connected appropriately to bus bars 17 and 18 ends 17a and 18a, respectively, so as to transfer current upwardly from the melt in a normal relationship thereto. So arranged the current traveling through forward conductor 15 is not in proximity to the melt 16 edges or end 11a of skull 11 to minimize the proximity effect of that current passage to the top end 11a of skull 11. In this arrangement the current passing through the melt is not encouraged by the proximity effect to travel through the skull 11 and into the crucible cooled shell 31 but will rather pass through that melt and thence directly through skull 11 into the heads 26 of return contacts 25. Further, it should be noted that forward conductor 15 and associated bus bars 17 and 18 preferably contain cooling coils or channels for liquid or gas coolant passage therethrough to maintain them at a relatively cool temperature for good electrical efficiency in accordance with widely practiced art. Return contact 25, as stated earlier herein, is like the forward contact 19 and so the description of the preferred construction of contact 19 should be taken as a description of a preferred construction of return contact 25 also.

The forward contact 19, as shown best in FIG. 6, preferrably consists of a body 20 having a conductive end 21 that includes a head 22 thereon that is installed in skull 11. Preferably, the contact is bonded thereto, as by brazing or some other process to form a joint having good electrical conductivity. A preferred arrangement of head 22, to avoid possible overheating at the point of contact between the head 22 and skull 11 due to constriction resistance effects, is such that the contact head 22 will have a diameter that is several times greater than the diameter of the necked region 21c of conductive end 21. Or, alternatively, constriction resistance can be reduced by increasing the number of contacts, thus distributing the current over a larger area of the skull, preferrably the present invention has two each forward and return contacts 19 and 25, though, of course, one or more than two of such contacts can be so used without departing from the scope of this disclosure. The principal criteria for selection of material for fabricating the conductive ends of contacts are that it have a relatively good electrical conductivity, adequate high temperature strength, reasonably good fabricability, and will not react adversely with the skull 11. In practice, molybdenum, columbium and tungsten are examples of metals that will, in general, be suitable for this purpose. The skull material may also be used in some cases, to fabricate the contacts. As previously stated, to minimize heat loss from the electrical contacts to the relatively cool bus bars, the length and cross sectional area of the necked region 21c of the conductive end 21 are so proportioned that the joule heat developed in this region is equal to twice the thermal loss that would occur if no current were flowing. Under these conditions the net heat flow across the contact head/skull interface is zero and the total heat loss from the contact is equal to the joule heat developed in the necked region.

Returning to FIG. 6, as shown therein, contact head 22 of forward contact 19 is installed within the skull 11, preferably bonded therein, and has bus bar 18 arranged across and between contact body end 20a and the contact neck region collar end 21a that is opposite to contact head 22, with the neck region 21 fitted through a hole 18b in bus bar 18. A lock nut 37 is turned over a threaded contact body end 20a, urging a gasket 38 against bus bar side 18c and also forcing bus bar side 18d against and electrically connecting it to a side 21b of collar end 21a of contact body 21, a gasket 39 being compressed therebetween. So arranged, current will be passed from bus bar 18 and into forward contact 19. As discussed earlier herein, that current passage creates heat, which heat is preferably dissipated by passage of a coolant, either liquid or gas, around the contact and bus bar. Shown in FIG. 6, to provide that cooling, a tube 40 is fitted through lock nut 37 and into a longitudinal opening 40a formed in the contact body end 20a passing coolant therethrough against a cavity end 21d of the neck region 21, cooling that neck region and head 22, the coolant flowing therefrom through return tube 41.

Current flowing, as shown at 24 in FIG. 5 and 23 in FIG. 4, through the melt 16, of course, creates magnetic lines of flux around that current flow, which flux lines tend to squeeze the area of current path. With a solid item such as the forward conductor 15 this magnetic squeeze effect does not materially alter the configuration of the conductor. However, with a molten material the material of the current flow path tends to be squeezed or otherwise acted upon by a "motor" effect of the flux lines, creating a stirring thereabout that tends to circulate material of the melt 16 through that current flow path, providing a mixing of the melt maintaining a substantially uniform temperature therethrough.

As stated earlier herein, the spacing of the proximity conductor from the melt surface needs to be maintained between limits for effective operation of the proximity effect. It has been determined that the proximity effect will be reasonably constant as long as the forward conductor 15 spacing above melt 16 does not greatly exceed the diameter of the forward conductor, which height can be maintained by a continuous addition of melt material into melt 16 as an ingot 35, shown in FIGS. 1 through 3, is withdrawn therefrom. The electric furnace 10 of the present invention is useful also for providing molten materials used for casting processes, it, of course, being possible to pour the melt materials from skull 11 if the furnace is modified with a suitable tilting mechanism and flexible power leads, not shown.

The direct coupling of the melt 16 to the current source 14 of the electric furnace 10 of the present invention also allows for passing an electric current through a powder of electrically conductive material, providing that material has been packed sufficiently to establish an unbroken current path therethrough. Obviously, once a current flow is established, the powder will be liquidized and, thereafter, additional solid materials could be added to maintain the melt level at the desired distance or spacing from the forward conductor 15. While the preferred embodiment of a heat absorbing container 12 and cooling arrangement therewith has been shown herein, it should be obvious that the container could be of a different configuration than that shown but would still come within the scope of this disclosure providing it employs a skull arrangement similiar to that described and provides for a direct coupling of a melt contained therein to a high frequency current source. Also, while a preferred arrangement of a forward conductor 15 has been shown herein, it should be obvious that other conductor configurations could be employed without departing from the subject matter coming within the scope of this disclosure. Further, while a preferred contact 19 has been shown and described herein, it should be obvious that the present disclosure is not limited to any particular contact configuration.

As disclosed hereinabove, the present invention involves a furnace 10 arranged to provide the direct coupling of a high frequency current supply 14 through melt 16 that is contained within a skull 11 for insuring a high purity of melt. The present invention involves also a process for producing, in an electric furnace, a melt of highest purity of a conductive material. The steps in practicing this process as outlined hereinbefore in detail, therefore involve, arranging in an appropriate furnace melt container a skull formed from the material to be melted in that container that is heat absorbing, which skull is connected electrically to forward and return contacts. Thereafter, a desired electrical current flow is provided through a forward conductor connected to a high frequency alternating current source, that forward conductor positioned above, and spaced a desired distance from the melt surface such that the current therethrough will induce, by a proximity effect, a return current to flow through the melt tracing therein the shape of the forward conductor thereabove. The current passes from the forward conductor entering the skull through the forward contact and exits therefrom through the return contact wherefrom it returns to the high frequency alternating current source, completing the circuit. The invention also involves controlling the outside temperature of the heat absorbing container and heat trnasfer therethrough from the skull, and balancing the heat loss and surface temperature of the skull to maintain the skull in a solid state and at a desired thickness.

While a preferred embodiment of an electric furnace and a process for producing a high purity of melt from certain electrically conductive materials has been shown and discussed herein it should be understood that the present disclosure is made by way of example only and that variations are possible without departing from the subject matter coming within the scope of the following claims, which claims I regard as my invention.

I claim:

1. An electric furnace comprising,
    a high frequency current source;
    a heat absorbing container;
    a skull formed to fit within said container from an electrically conductive material, the skull formed to have an open center portion to contain a melt of an electrically conductive material to be melted;
    a forward conductor arranged over and substantially parallel to the container and skull top therein, said forward conductor spaced appropriately from a material to be melted in said skull such that a current passage therethrough will cause a return current through said melt to follow a path that approximates the shape of said forward conductor;
    means for connecting said high frequency current source to one end of said forward conductor;
    forward and return contact means installed in said skull;
    means for connecting said forward contact to the other end of said forward conductor;
    means for connecting said return contact means to said high frequency current source; and
    cooling means for providing a heat transfer from said skull for maintaining said skull in a solid state.

2. An electric furnace as recited in claim 1, wherein, the skull is formed from a monolithic body of the melt material that is appropriately fitted into a heat absorbing container and connected to the high frequency current source, the skull being formed in situ, the center thereof becoming molten, by a controlled heating from said current passed therethrough and cooling of the outer surface thereof by a heat transfer through said container.

3. An electric furnace as recited in claim 1 wherein a temperature sensing means is included with the skull for monitoring the temperature thereof.

4. An electric furnace as recited in claim 1 wherein, the skull has the heads of the forward and return contact means bonded therein.

5. An electric furnace as recited in claim 1, wherein the forward conductor includes a cooling means for maintaining its temperature below its melting point during current passage therethrough.

6. An electric furnace as recited in claim 5, wherein the cooling means consists of a longitudinal channel formed through the forward conductor for passing a coolant therethrough.

7. An electric furnace as recited in claim 1 further including,
    a magnetic core of high permeability material secured to the forward conductor such that only that surface of said forward conductor opposite to the surface of a melt in the skull is exposed.

8. An electric furnace as recited in claim 1, wherein, the forward conductor is formed in a horseshoe shape.

9. An electric furnace as recited in claim 1, wherein, the means for connecting the high frequency current source to the one end of the forward conductor is,
    a bus bar electrically connected on its one end to extend upwardly from and normal to the forward conductor, said bus bar passing well above the container and skull edge and is electrically connected at its other end to the high frequency current source.

10. An electric furnace as recited in claim 9, the forward and return contact means are alike and each consists of,
    a head end for installation within the skull;
    a contact body extending from said head and container side;
    means for electrically connecting said contact body into the current flow; and
    means for removing heat from said contact.

11. An electric furnace as recited in claim 10, wherein the diameter of the head end is greater than the diameter of the contact body.

12. An electric furnace as recited in claim 10 wherein the
    means for removing heat from said contact consists of,
    means for transporting a coolant into said contact and circulating said coolant against the contact body; and
    means for transporting said coolant from said contact.

13. An electric furnace as recited in claim 1, wherein the
    means for connecting said forward contact to the other end of said forward conductor consists of,
    a bus bar electrically connected on its one end to extend upwardly from and normal to the forward conductor other end, said bus bar passing well above the crucible and skull edge and electrically connecting to said forward contact.

14. An electric furnace as recited in claim 1, wherein the means for connecting said return contact means to said high frequency current source consists of,
    a bus bar electrically connected on its one end to said return contact and electrically connected to said alternating current source on its other end.

15. An electric furnace as recited in claim 1, wherein the cooling means for providing a heat transfer from said skull for maintaining said skull in a solid state consists of, cooling coil means arranged with the heat absorbing container for passing a coolant therethrough to remove heat from said container that has passed thereto from said skull.

16. An electric furnace as recited in claim 15, wherein the heat absorbing container consists of,
    a cooled shell wherearound the cooling coil means are arranged and an inner refractory supporting shell having insulative supports arranged therebetween.

17. An electric furnace as recited in claim 16, wherein radiation shields are arranged in the area between the cooled shell and refractory supporting shell.

18. An electric furnace as recited in claim 16, wherein a solid insulative material is arranged in the area between the cooled shell and refractory supporting shell.

19. An electric furnace as recited in claim 1 wherein the cooling means for providing a heat transfer from said skull for maintaining said skull in a solid state consists of,
    means for altering the ambient gas pressure in a chamber wherein the electric furnace is operated.

20. A process for producing a high purity of melt of a conductive material consisting of the steps of,
    in a heat absorbing container arranging a skull formed of a conductive material,
    arranging a forward conductor across substantially parallel to, and spaced apart from the top of said skull such that electrical current flowing through said forward conductor will provide a proximity effect to a return current flow across said skull;

electrically connecting said forward conductor to a high frequency current source and to a contact arranged with said heat absorbing container to pass electrical current into said skull;

electrically connecting said skull to said high frequency current source;

cooling the crucible; and as needed, adding melt material to said skull to maintain a desired level of melt therein.

21. A process as recited in claim 20, further including; cooling the forward conductor during current passage therethrough.

22. A process as recited in claim 20, further including, monitoring the skull temperature during current passage therethrough.

23. A process as recited in claim 20 further including, controlling the heat absorbing container temperature by passing coolant through coils arranged therewith.

24. A process as recited in claim 20, further including controlling the skull temperature by installing, as needed, radiation shields in a space between a cooled shell and a refractory supporting shell.

25. A process as recited in claim 20, further including controlling the skull temperature by altering, as needed, the ambient gas pressure within a melt chamber wherein the electric furnace is operated.

26. A process as recited in claim 20, further including controlling the skull temperature by conducting heat therefrom through a solid material placed between a cooled shell and a refractory supporting shell.

* * * * *